United States Patent
Park et al.

(10) Patent No.: US 7,420,418 B2
(45) Date of Patent: Sep. 2, 2008

(54) CIRCUIT FOR IMPROVING AMPLIFICATION AND NOISE CHARACTERISTICS FOR MOSFET, AND FREQUENCY MIXER, AMPLIFIER AND OSCILLATOR USING THE CIRCUIT

(75) Inventors: Chul Soon Park, Yuseong-Gu (KR); Ho Suk Kang, Yuseong-Gu (KR)

(73) Assignee: Research and Industrial Cooperation Group, Daejeon-Shi (KR)

( * ) Notice: Subject to any disclaimer, the term of this patent is extended or adjusted under 35 U.S.C. 154(b) by 66 days.

(21) Appl. No.: 11/651,809

(22) Filed: Jan. 10, 2007

(65) Prior Publication Data

US 2008/0024223 A1 Jan. 31, 2008

(30) Foreign Application Priority Data

Jul. 28, 2006 (KR) .................. 10-2006-0071187

(51) Int. Cl.
*H03F 3/16* (2006.01)
(52) U.S. Cl. .................. 330/277; 330/307
(58) Field of Classification Search ........ 330/277, 330/285, 296, 307
See application file for complete search history.

(56) References Cited

U.S. PATENT DOCUMENTS

| | | | | |
|---|---|---|---|---|
| 3,390,314 A | * | 6/1968 | Medwin | 327/556 |
| 3,436,621 A | * | 4/1969 | Crawford | 330/277 |
| 5,192,920 A | * | 3/1993 | Nelson et al. | 330/277 |
| 6,127,892 A | * | 10/2000 | Komurasaki et al. | 330/277 |
| 6,642,795 B2 | * | 11/2003 | Koen et al. | 330/298 |

* cited by examiner

*Primary Examiner*—Henry K Choe
(74) *Attorney, Agent, or Firm*—The Webb Law Firm

(57) ABSTRACT

A circuit for improving amplification and noise characteristics of a Metal-Oxide-Semiconductor Field-Effect Transistor (MOSFET), and a frequency mixer, an amplifier and an oscillator using the circuit are provided. A gate terminal of the MOSFET is connected to a body terminal of the MOSFET through a capacitor and the gate and body terminals of the MOSFET are connected to a current source to simultaneously provide a signal to both the gate terminal and the body terminal, in order to improve amplification and noise characteristics of the MOSFET. As a result, a higher level of amplification and a lower level of noise than the conventional art can be obtained.

10 Claims, 5 Drawing Sheets

[FIG. 1]
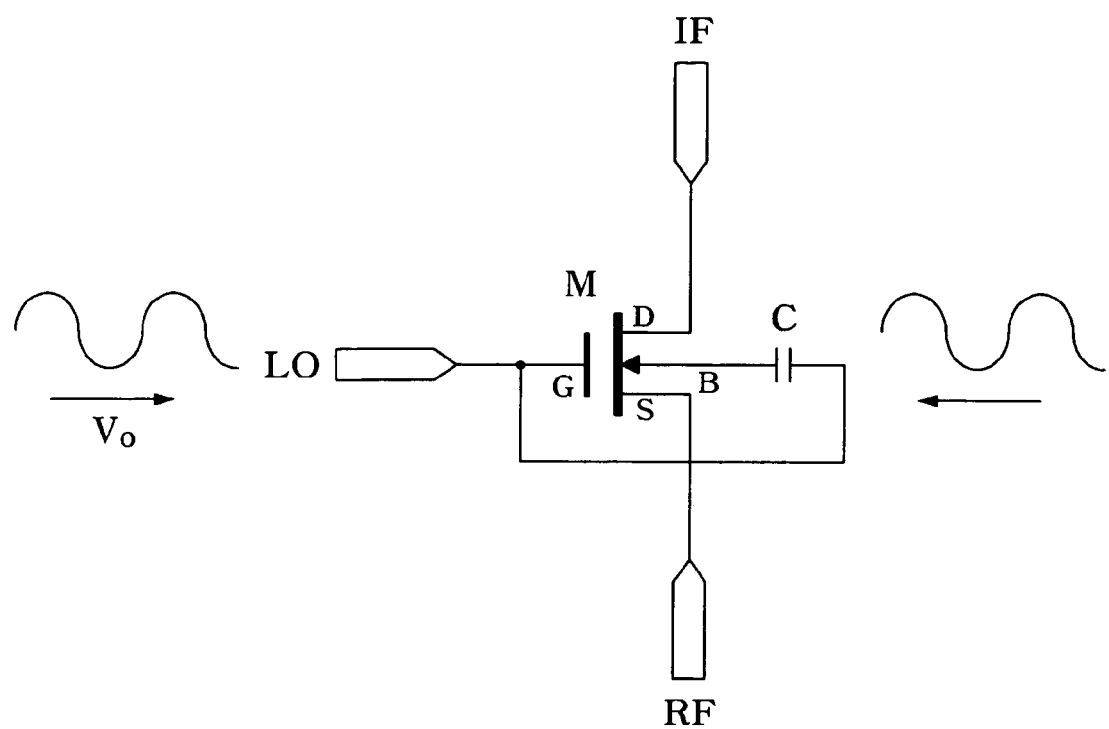

[FIG. 2]
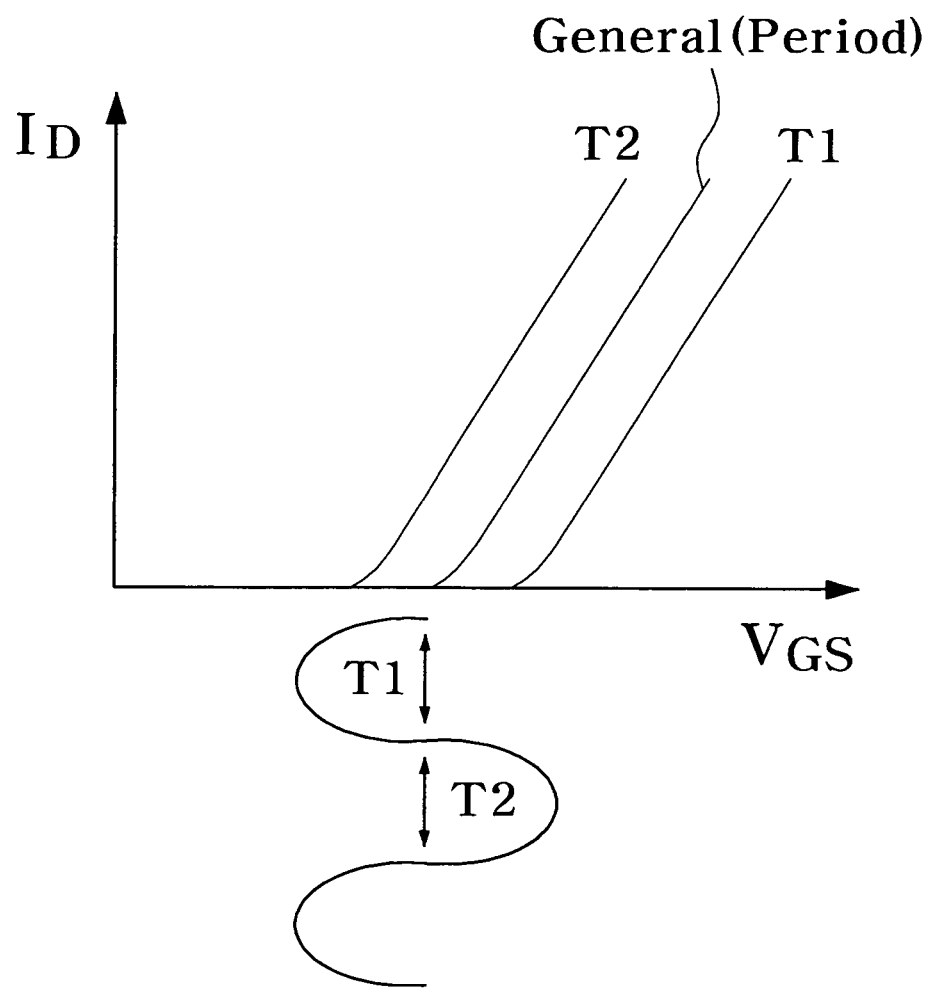

[FIG. 3]
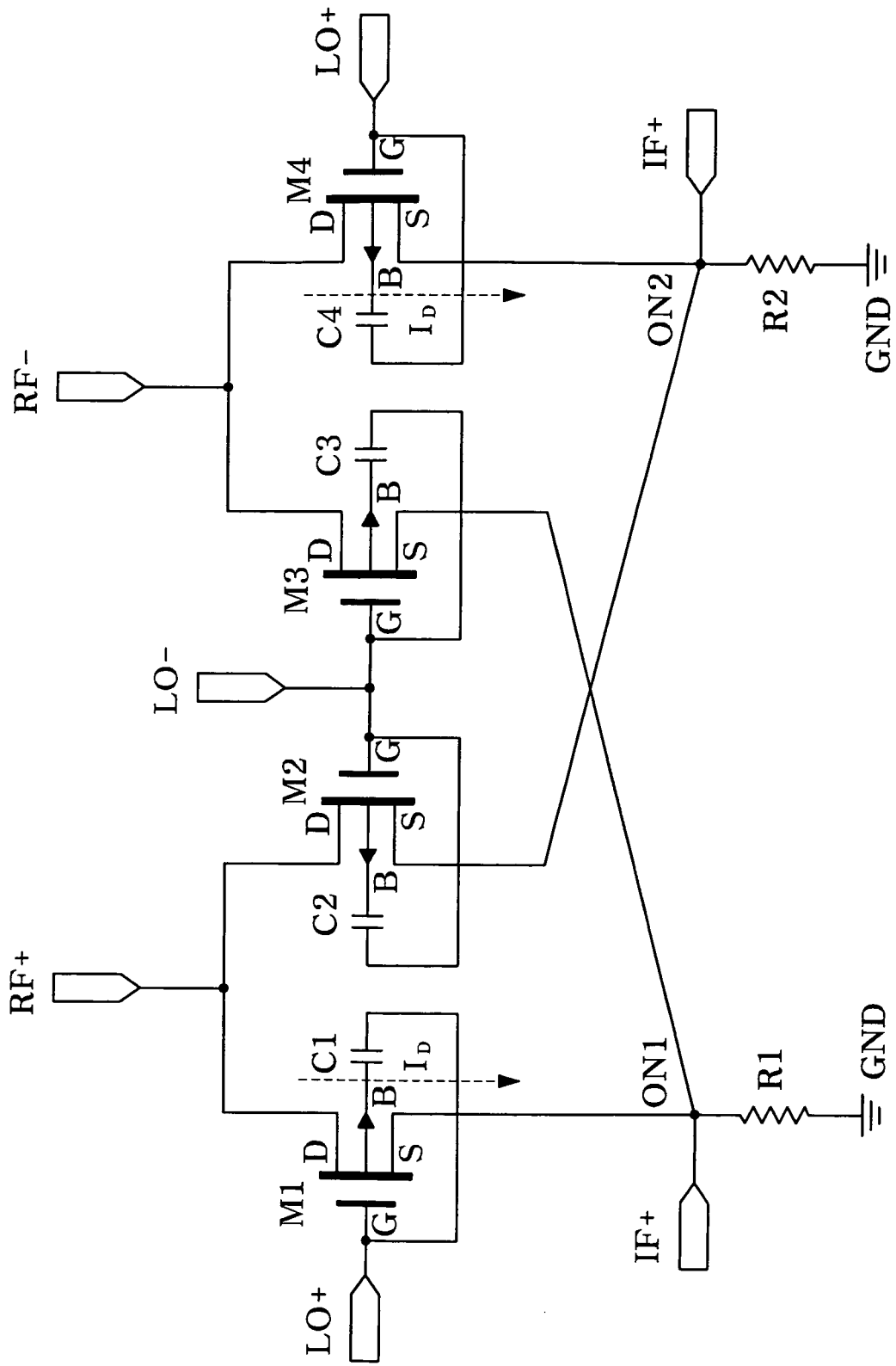

[FIG. 4]
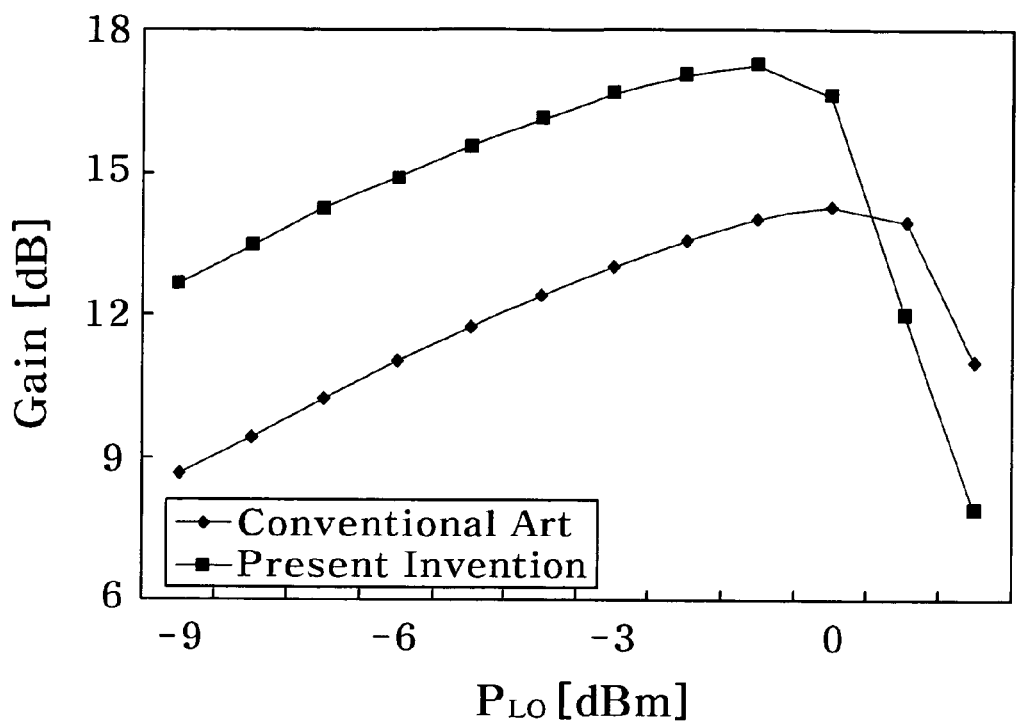

[FIG. 5]
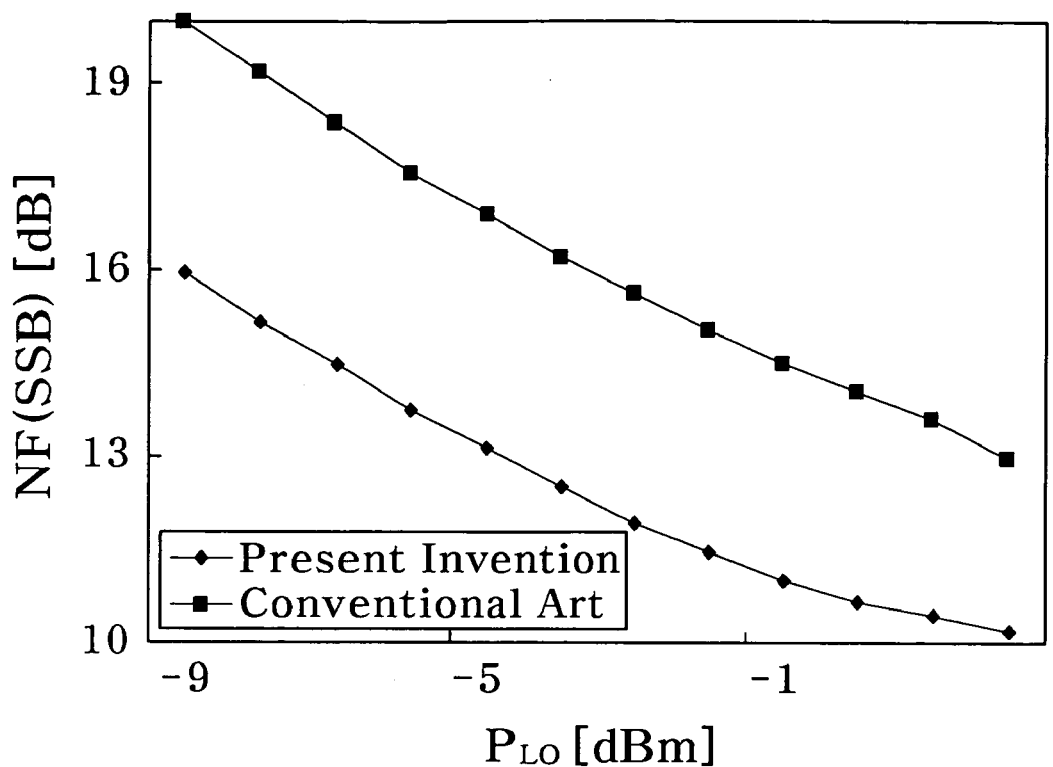

CIRCUIT FOR IMPROVING AMPLIFICATION AND NOISE CHARACTERISTICS FOR MOSFET, AND FREQUENCY MIXER, AMPLIFIER AND OSCILLATOR USING THE CIRCUIT

BACKGROUND OF THE INVENTION

1. Field of the Invention

The present invention relates to a circuit for improving amplification and noise characteristics of a Metal-Oxide-Semiconductor Field-Effect Transistor (MOSFET), and a frequency mixer, an amplifier and an oscillator using the circuit. More particularly, the present invention relates to a circuit for improving amplification and noise characteristics of a MOSFET which enables a MOSFET receiving and amplifying a signal to obtain a greater degree of amplification and a lower level of noise than when using a conventional circuit, and a frequency mixer, an amplifier and an oscillator using the circuit, 2. Description of the Related Art Nowadays, wireless communication technology is developing at an accelerating pace, and communication standards are established according to the intended purpose of the technology. A current goal in the development of wireless communication technology is the incorporation of various communication standards into a single mobile communication device.

To provide simultaneous compatibility with various different standards, a Direct-Conversion method is widely used. However, to reduce signal distortion, a frequency mixer having excellent 1/f noise characteristics is required. The noise characteristics of the frequency mixer are very important because they have a considerable effect on overall 1/f noise in a transceiver, and 1/f noise causes serious signal distortion in a standard having a narrow frequency bandwidth.

Accordingly, additional inductors or capacitors are used to make filter circuits filter out noise-band signals and thereby improve noise characteristics. Also, a passive device, which has better noise characteristics than an active device, is used to reduce signal distortion. However, a frequency mixer formed of passive devices does not amplify a signal but rather attenuates it.

SUMMARY OF THE INVENTION

Accordingly, it is an object of the present invention to provide a circuit for improving amplification and noise characteristics of a Metal-Oxide-Semiconductor Field-Effect Transistor (MOSFET) which enables a MOSFET receiving and amplifying a signal to obtain a greater degree of amplification and a lower level of noise than when using a conventional circuit, and a frequency mixer, an amplifier and an oscillator using the circuit.

Another object of the present invention provides a circuit for improving amplification and noise characteristics of a MOSFET, in which the MOSFET performs a switching operation at a switch stage among circuits of a frequency mixer using the body effect, so that amplification and noise characteristics are improved. Also, the present invention may be applied to other components of a transceiver (e.g., an amplifier, an oscillator, etc.). Further, a differential LC oscillator using the body effect according to the present invention may exhibit improved noise characteristics at the same output voltage swing as in the conventional art.

A first aspect of the present invention provides a circuit for improving amplification and noise characteristics of a MOSFET, in which a gate terminal of the MOSFET is connected to a body terminal of the MOSFET through a capacitor and the gate and body terminals of the MOSFET are connected to a current source to simultaneously provide a signal to both the gate terminal and the body terminal, in order to improve amplification and noise characteristics of the MOSFET.

Here, the MOSFET may be a P-channel MOSFET (PMOSFET) or an N-channel MOSFET (NMOSFET).

The signal may be a local oscillator (LO) signal.

The signal applied to the body terminal of the MOSFET may be applied to change a body voltage.

The local oscillator (LO) signal applied to the gate terminal of the MOSFET may be combined with a radio frequency (RF) that is applied to a source terminal of the MOSFET so that an intermediate frequency (IF) signal corresponding to the sum and difference of the frequencies is generated through a drain terminal of the MOSFET.

In a differential structure, while a differential signal of an external oscillator is applied to the gate terminal of the MOSFET, when a signal that has the same phase as the differential signal is applied to the body terminal of the MOSFET, the body terminal of the MOSFET may apply power at the same level as the source terminal, through a different path to prevent connection with the radio frequency (RF) signal.

A second aspect of the present invention provides a frequency mixer using a circuit for improving amplification and noise characteristics of a MOSFET.

A third aspect of the present invention provides an amplifier using a circuit for improving amplification and noise characteristics of a MOSFET.

A fourth aspect of the present invention provides an oscillator using a circuit for improving amplification and noise characteristics of a MOSFET.

BRIEF DESCRIPTION OF THE DRAWINGS

The foregoing and other objects, features and advantages of the invention will become more apparent from the following description of exemplary embodiments of the invention with reference to the accompanying drawings, in which:

FIG. 1 illustrates a circuit for improving amplification and noise characteristics of a Metal-Oxide-Semiconductor Field-Effect Transistor (MOSFET) according to an exemplary embodiment of the present invention;

FIG. 2 is a graph of threshold voltage versus period of a local oscillator (LO) signal according to an exemplary embodiment of the present invention;

FIG. 3 illustrates a frequency mixer using a circuit for improving amplification and noise characteristics of a MOSFET according to an exemplary embodiment of the present invention;

FIG. 4 is a graph comparing amplification of a conventional frequency mixer and a frequency mixer using a circuit for improving amplification and noise characteristics of a MOSFET according to an exemplary embodiment of the present invention; and FIG. 5 is a graph comparing noise characteristics of a conventional frequency mixer and a frequency mixer using a circuit for improving amplification and noise characteristics of a MOSFET according to an exemplary embodiment of the present invention.

DETAILED DESCRIPTION OF THE INVENTION

The present invention will now be described more fully hereinafter with reference to the accompanying drawings, in which exemplary embodiments of the invention are shown.

This invention may, however, be embodied in different forms and should not be construed as limited to the exemplary embodiments set forth herein. Rather, these exemplary embodiments are provided so that this disclosure will be thorough, complete, and enabling of practice of the invention by one of ordinary skill in the art. Like reference numerals refer to like elements throughout the drawings.

FIG. 1 illustrates a circuit for improving amplification and noise characteristics of a Metal-Oxide-Semiconductor Field-Effect Transistor (MOSFET) according to an exemplary embodiment of the present invention.

Referring to FIG. 1, a gate terminal G of a MOSFET M is connected to a body terminal B of the MOSFET M through a capacitor C in the circuit for improving the amplification and noise characteristics of a MOSFET according to an exemplary embodiment of the present invention.

In the present exemplary embodiment, the MOSFET M is an N-channel MOSFET (NMOSFET). However, in an alternative exemplary embodiment, a P-channel MOSFET (PMOSFET), which has better 1/f noise characteristics, may be used to improve noise characteristics.

Further, since a current source (not shown) is connected to both the gate terminal G and the body terminal B so that a signal is simultaneously provided thereto, higher amplification and better noise characteristics can be obtained than in the conventional art.

In other words, the body effect is used to improve the amplification and noise characteristics of the MOSFET M. Here, the threshold voltage $V_t$ of the MOSFET M can be obtained by the following Equation 1:

$$V_t = V_{to} + \gamma[\sqrt{2\Phi_f + V_{SB}} - \sqrt{2\Phi_f}]$$ [Equation 1]

Here, $V_{to}$ denotes the value of $V_t$ when $V_{SB}$ is equal to zero (0), $\gamma$ denotes a manufacturing process parameter, and $\Phi_f$ denotes a hardware parameter. Further, $\gamma$ can be represented by the following Equation 2:

$$\gamma = \frac{\sqrt{2qN_A\varepsilon_s}}{C_{ox}}$$ [Equation 2]

Here, $N_A$ denotes a doping concentration of a substrate, $\varepsilon_s$ denotes the permittivity of silicon, and $C_{OX}$ denotes the permittivity of oxide per unit area.

As shown in Equation 2, as the voltage of the body terminal B of the MOSFET M increases, a threshold voltage $V_t$ decreases. A supply voltage $V_o$ is applied to the gate terminal G of the MOSFET to enable it to operate, and a local oscillator (LO) signal $V_{LO}\cos\omega t$ is input.

Then, a radio frequency (RF) signal $V_{RF}\cos\omega t$ is applied to a source terminal S of the MOSFET M to mix frequencies. Also, the local oscillator (LO) signal $V_{LO}\cos\omega t$ applied to the gate terminal G of the MOSFET M is applied to the body terminal B through the capacitor C as well.

Here, the local oscillator (LO) signal applied to the body terminal B of the MOSFET M is applied to change a body voltage according to time. Generally, to switch the MOSFET M, a bias is controlled so that the supply voltage $V_o$ approaches close to the threshold voltage $V_{th}$, and the local oscillator (LO) signal has a power of about 0 dBm.

FIG. 2 is a graph of threshold voltage versus period of the local oscillator (LO) signal input to the gate terminal G of the MOSFET M.

Referring to FIG. 2, when the local oscillator (LO) signal has a period T1, the voltage of the body terminal B of the MOSFET M decreases so that the threshold voltage $V_t$ increases.

In contrast, when the local oscillator (LO) signal has a period T2, the voltage of the body terminal B of the MOSFET M increases so that the threshold voltage $V_t$ decreases. Consequently, using the body effect on the local oscillator (LO) signal increases its power level. Therefore, higher amplification and better noise characteristics than the conventional art can be obtained.

Meanwhile, in the graph in FIG. 2, voltage $V_{GS}$ applied to the gate terminal G and the source terminal S of the MOSFET M is plotted on the horizontal axis and drain current $I_D$ of the MOSFET M is plotted on the vertical axis.

FIG. 3 illustrates a frequency mixer using a circuit for improving amplification and noise characteristics of a MOSFET according to an exemplary embodiment of the present invention, in which the body effect is applied to a frequency mixer that has a Gilbert cell structure.

Referring to FIG. 3, while the Gilbert circuit consists of a transconductance stage and a switching stage, the circuit illustrated in FIG. 3 has only a switching stage.

Meanwhile, the MOSFET used in the frequency mixer according to the exemplary embodiment of the present invention is a PMOSFET, which has better 1/f noise characteristics. However, in alternative exemplary embodiments, an NMOSFET may be used.

The frequency mixer using the circuit for improving the amplification and noise characteristics of the MOSFET according to an exemplary embodiment of the present invention includes first to fourth MOSFETs M1 to M4, first to fourth capacitors C1 to C4, and first and second resistances R1 and R2.

Here, a source terminal S of the first MOSFET M1 is connected to a first output terminal ON1, a drain terminal D is connected to a first radio frequency (RF) signal terminal RF+, and a gate terminal G is connected to a first local oscillator (LO) signal terminal LO+ and to a body terminal B through the first capacitor C1.

A source terminal S of the second MOSFET M2 is connected to a second output terminal ON2, a drain terminal D is connected to the first radio frequency (RF) signal terminal RF+ together with the drain terminal of the first MOSFET M1, and a gate terminal G is connected to a second local oscillator (LO) signal terminal LO− and to a body terminal B through the second capacitor C2.

A source terminal S of the third MOSFET M3 is connected to the first output terminal ON1 together with the source terminal S of the first MOSFET M1, a drain terminal D is connected to a second radio frequency (RF) signal terminal RF−, and a gate terminal G is connected to the second local oscillator (LO) signal terminal LO− together with the gate terminal G of the second MOSFET M2, and to a body terminal B through the third capacitor C3.

A source terminal S of the fourth MOSFET M4 is connected to the second output terminal ON2 together with the source terminal S of the second MOSFET M2, a drain terminal D is connected to the second radio frequency (RF) signal terminal RF− together with the drain terminal of the third MOSFET M3, and a gate terminal G is connected to the first local oscillator (LO) signal terminal LO+ and to a body terminal B through the fourth capacitor C4.

Further, the first output terminal ON1 is connected to an intermediate frequency signal terminal IF+, and the first resistance R1 is connected between the first output terminal ON1 and ground GND. The second output terminal ON2 is connected to another intermediate frequency signal terminal IF+, and the second resistance R2 is connected between the second output terminal ON2 and ground GND.

Operation of the frequency mixer using the circuit for improving amplification and noise characteristics of the MOSFET having the above-described configuration will be described below in detail.

First, when the first local oscillator (LO) signal is applied to the gate terminal G of the first MOSFET M1, it is also applied to the body terminal B of the first MOSFET M1 through the first capacitor C1.

When the voltage of the gate terminal G of the first MOSFET M1 decreases, the voltage of the body terminal B decreases. Consequently, while the voltage difference between the gate and source terminals increases, the threshold voltage decreases. Therefore, overdrive voltage increases when the gate terminal G of the first MOSFET M1 is in an on state compared with when the body effect is not used.

In contrast, when the voltage of the gate terminal G of the first MOSFET M1 increases, the voltage of the body terminal B of the first MOSFET M1 also increases, and thus the threshold voltage increases. Therefore, the first MOSFET M1 is completely turned off.

In addition, the second to fourth MOSFETs M2 to M4 operate in the same way as the first MOSFET described above.

More specifically, the first and fourth MOSFETs M1 and M4 are turned on during one period according to the first and second local oscillator (LO) signals LO+ and LO− (at this time, the second and third MOSFETs M2 and M3 are turned off), and the second and third MOSFETs M2 and M3 are turned on during another period (at this time, the first and fourth MOSFETs M1 and M4 are turned off).

Drain currents of the first and fourth MOSFETs M1 and M4 may be obtained by the following Equations 3, and are respectively multiplied by the first and second resistances R1 and R2 to generate output voltages.

$$K = \frac{1}{2}\mu_n C_{ox} \frac{W}{L} \quad \text{[Equation 3]}$$
$$I_D = K(V_{GS} - V_{TH})^2$$

Meanwhile, as shown by the following Equations 4, there is a slight difference in the equations for current between NMOSFETs and PMOSFETs.

NMOS [Equation 4]
$$K = \frac{1}{2}\mu_n C_{ox} \frac{W}{L}$$
$$I_D = K(V_{GS} - V_{TH})^2$$
PMOS
$$K = \frac{1}{2}\mu_p C_{ox} \frac{W}{L}$$
$$I_D = K(V_{SG} - |V_{THp}|)^2$$

The difference between NMOSFETs and PMOSFETs in Equations 4 is only a voltage level.

While the frequency mixer generally employs NMOSFETs, PMOSFETs may be used since they have better 1/f noise characteristics.

Meanwhile, the amplification of the frequency mixer is given by the following Equations 5. As the local oscillator (LO) signal and a resistance value R increase, higher amplification is obtained. In addition, a signal having a frequency corresponding to the sum and difference of the radio frequency (RF) and the local oscillator (LO) frequency is obtained at an output. Here, $\cos(w_{RF}-w_{LO})t$ denotes a desired low-frequency signal.

$$I_D * R = V_{out} \quad \text{[Equation 5]}$$
$$V_{out} = K(V_{GS} - V_{TH})^2$$
$$= K(V_G + v_{RF} - V_S - v_{LO} - V_{TH})^2 *$$
$$RV_{out} \propto K * 2 * v_{RF} * v_{LO} * Rv_{RF}\cos(w_{RF}t) *$$
$$v_{LO}\cos(w_{LO}t)$$
$$= \frac{1}{2}\{\cos(w_{RF} + w_{LO})t + \cos(w_{RF} - w_{LO})t\}$$

FIG. 4 is a graph showing a comparison of amplification between a conventional art and a frequency mixer using a circuit for improving amplification and noise characteristics of a MOSFET of the present invention.

Referring to FIG. 4, a difference in amplification between the present invention in which body effect is used and the conventional art in which the body effect is not used, i.e., a difference in gain is shown. It can be known that the conventional art in which the body effect is not used requires a local oscillator (LO) signal with a power of about 6 to 7 dB higher to obtain the same level gain as the present invention.

FIG. 5 is a graph comparing of noise characteristics of the conventional art and a frequency mixer using a circuit for improving amplification and noise characteristics of a MOSFET of the present invention.

Referring to FIG. 5, a difference in noise characteristic (NF(SSB)) between the present invention in which the body effect is used, and the conventional art in which the body effect is not used, is shown. As illustrated in FIG. 4, the conventional art in which the body effect is not used requires a local oscillator (LO) signal with about 6 to 7 dB higher power to obtain the same level of noise as the present invention.

Meanwhile, while the circuit for improving amplification and noise characteristics of a MOSFET is applied to a frequency mixer among circuits of a super-high frequency transceiver in the above-described exemplary embodiment of the present invention, it is not limited to a frequency mixer and may also be applied to other components, i.e., an amplifier, an oscillator, etc.

As described above, according to a circuit for improving amplification and noise characteristics of a Metal-Oxide-Semiconductor Field-Effect Transistor (MOSFET), and a frequency mixer, an amplifier and an oscillator using the circuit of the present invention, when a signal having the same power level is input and amplified during operation of a MOSFET, higher amplification and better noise characteristics can be obtained than when using the conventional circuit.

Also, according to the present invention, the MOSFET performs a switching operation at a switch stage among circuits of a frequency mixer using the body effect, so that amplification and noise characteristics are further improved. This can be applied to other components of a transceiver (i.e., an amplifier, an oscillator, etc.) as well. In addition, a differential LC oscillator using the body effect according to the present invention exhibits improved noise characteristics at the same output voltage swing as in the conventional art.

While the present invention has been described with reference to exemplary embodiments thereof, it will be understood by those skilled in the art that various changes in from and detail may be made therein without departing from the scope of the present invention as defined by the following claims.

What is claimed is:

1. A circuit for improving amplification and noise characteristics of a Metal-Oxide-Semiconductor Field-Effect Transistor (MOSFET), in which a gate terminal of the MOSFET is connected to a body terminal of the MOSFET through a capacitor and the gate and body terminals of the MOSFET are connected to a current source to simultaneously provide a signal to both the gate terminal and the body terminal, in order to improve amplification and noise characteristics of the MOSFET.

2. The circuit of claim 1, wherein the MOSFET is a P-channel MOSFET (PMOSFET).

3. The circuit of claim 1, wherein the MOSFET is an N-channel MOSFET (NMOSFET).

4. The circuit of claim 1, wherein the signal is a local oscillator (LO) signal.

5. The circuit of claim 1, wherein the signal applied to the body terminal of the MOSFET is applied to change a body voltage according to time.

6. The circuit of claim 1, wherein a local oscillator (LO) signal applied to the gate terminal of the MOSFET is combined with a Radio Frequency (RE) signal that is applied to a source terminal of the MOSFET so that an intermediate frequency (IF) corresponding to a sum and a difference of the frequencies is generated through a drain terminal of the MOSFET.

7. The circuit of claim 1, wherein the body terminal of the MOSFET applies the same level power as the source terminal of the MOSFET through another path so that the power is not connected with the radio frequency (RF) signal when a signal having the same phase as a differential signal of an external oscillator is applied to the body terminal of the MOSFET while the differential signal is applied to the gate terminal of the MOSFET in a differential structure.

8. A frequency mixer using a circuit for improving amplification and noise characteristics of a MOSFET according to claim 1.

9. An amplifier using a circuit for improving amplification and noise characteristics of a MOSFET according to claim 1.

10. An oscillator using a circuit for improving amplification and noise characteristics of a MOSFET according to claim 1.

* * * * *

UNITED STATES PATENT AND TRADEMARK OFFICE
CERTIFICATE OF CORRECTION

| | |
|---|---|
| PATENT NO. | : 7,420,418 B2 |
| APPLICATION NO. | : 11/651809 |
| DATED | : September 2, 2008 |
| INVENTOR(S) | : Park et al. |

Page 1 of 1

It is certified that error appears in the above-identified patent and that said Letters Patent is hereby corrected as shown below:

Column 8, Line 3, Claim 6, "Radio Frequency (RE)" should read
-- Radio Frequency (RF) --

Signed and Sealed this

Sixth Day of January, 2009

JON W. DUDAS
*Director of the United States Patent and Trademark Office*